(12) United States Patent
Kim et al.

(10) Patent No.: US 6,670,853 B2
(45) Date of Patent: Dec. 30, 2003

(54) DATA RECOVERY CIRCUIT AND METHOD THEREOF

(75) Inventors: Suk-ki Kim, Seoul (KR); Jae-shin Lee, Anyang (KR); Bong-young Chung, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 10/143,154

(22) Filed: May 10, 2002

(65) Prior Publication Data

US 2002/0186087 A1 Dec. 12, 2002

(30) Foreign Application Priority Data

Jun. 11, 2001 (KR) ........................................ 2001-32496

(51) Int. Cl.[7] ............................................... H03L 7/00
(52) U.S. Cl. ...................................... 331/1 A; 375/375
(58) Field of Search ............................. 331/100, 1 A, 331/14, DIG. 2; 375/373–376; 327/145, 147, 149, 152, 153, 156, 158, 161, 47

(56) References Cited

U.S. PATENT DOCUMENTS 5,963,606 A * 10/1999 Drost et al. ................. 375/371
6,128,557 A * 10/2000 Fenton et al. ................. 701/13
6,310,521 B1 * 10/2001 Dalmia ......................... 331/11
6,337,589 B1 * 1/2002 Ooishi ......................... 327/156

FOREIGN PATENT DOCUMENTS

KR          00-0056531       9/2000   ............. H03L/7/00

OTHER PUBLICATIONS

Tanoi et al., A 250–622 MHz Deskew and Jitter–Suppressed Clock Buffer Using Two–Loop Architecture Apr. 1996, IEEE Journa of Solid–State Circuits, vol. 31, No. 4, 487–493.*

* cited by examiner

Primary Examiner—Kenneth B. Wells
Assistant Examiner—Cassandra Cox
(74) Attorney, Agent, or Firm—Mills & Onello LLP

(57) ABSTRACT

A data recovery circuit and a method thereof, which are capable of reducing locking time and jitter, are provided. The data recovery circuit includes a frequency-locked loop, a locking detector, a delay-locked loop, and a data determination circuit. The frequency-locked loop locks the frequency of an internal clock signal fed back thereto in response to an input signal with the frequency of the input signal and generates a frequency locking signal representing that the input signal is frequency-locked with the internal clock signal. The locking detector determines whether the frequency of the internal clock signal is in a predetermined frequency range of the input signal in response to the frequency locking signal and generates a phase control signal. The delay-locked loop is controlled by the phase control signal, locks the phase of the internal clock signal with the phase of the input signal, and generates a recovery locking signal. The data determination circuit receives the recovery locking signal as a clock signal, receives the input signal in response to the clock signal, and outputs the input signal as output data.

17 Claims, 3 Drawing Sheets

DATA RECOVERY CIRCUIT AND METHOD THEREOF

BACKGROUND OF THE INVENTION

1. Field of the Invention

The present invention relates to data communication, and more particularly, to a circuit and method for recovering data and a clock signal in a receiver in a data transmission system.

2. Description of the Related Art

Conventionally, phase-locked loops (PLL) are widely used to recover clock signals from data received at a receiving end of a data communication or transmission system and then extract and recover the data using the recovered clock signals. Clock signal and data recovery circuits like PLLs are required to have a short locking time and low jitter and skew so as to reduce a bit error rate (BER).

To meet these demands, data recovery circuits having a dual loop structure including a frequency-locked loop (FLL) and a phase-locked loop (PLL) are generally used. Data recovery circuits having such a structure perform frequency locking of signals through the use of the frequency-locked loop first and then perform phase locking of signals through the use of the phase-locked loop.

However, the conventional data recovery circuits have a few drawbacks. Specifically, the frequency-locked loop (FLL) or the phase-locked loop (PLL) uses a voltage controlled oscillator (VCO), which introduces significant noise caused by power supplies or heat. The noise of the voltage controlled oscillator VCO cannot be removed from the output of the phase-locked loop and acts as jitter. This problem can be slightly alleviated by decreasing the gain of the phase-locked loop, but if the gain of the phase-locked loop is reduced, the locking time increases considerably.

In addition, in order to decrease the locking time in the data recovery circuit having the dual loop structure, the frequency range of the phase-locked loop having a low response speed must be reduced by increasing the resolution of the frequency-locked loop and reducing errors, which may occur during frequency locking, to the minimum.

SUMMARY OF THE INVENTION

To solve the above-described problems, it is a first object of the present invention to provide a data recovery circuit and method which simultaneously reduce jitter and locking time.

Accordingly, to achieve the first object, there is provided a data recovery circuit including a frequency-locked loop, a locking detector, a delay-locked loop, and a data determination circuit. The frequency-locked loop locks the frequency of an internal clock signal fed back into the frequency-locked loop in response to an input signal with the frequency of the input signal and generates a frequency locking signal representing that the internal clock signal is frequency-locked with the input signal. The locking detector determines whether not the frequency of the internal clock signal is in a predetermined frequency range of the input signal in response to the frequency locking signal and generates a phase control signal. The delay-locked loop is controlled by the phase control signal and locks the phase of the internal clock signal with the phase of the input signal and generates a recovery locking signal. The data determination circuit receives the recovery locking signal as a clock signal and receives the input signal in response to the clock signal, and outputs the input signal as output data.

In one embodiment, the frequency-locked loop includes a frequency detector, a charge pump, a low-pass filter and an oscillator. The frequency-locked loop compares the frequency of the input signal with the frequency of the internal clock signal, detects the frequency difference between the input signal and the internal clock signal, and generates the frequency locking signal. The charge pump is charged or discharged in response to the output of the frequency detector. The low-pass filter removes a high-frequency component from the output signal of the charge pump and generates a control voltage. The oscillator generates the internal clock signal in response to the control voltage, compares the frequency of the internal clock signal with the frequencies of the input signal at rising and falling edges, and detects the frequency difference between the internal clock signal and the input signal.

In one embodiment, a lock window of the locking detector has hysteresis characteristics in order to prevent the frequency-locked loop from deviating from a locked state.

In one embodiment, the delay-locked loop includes a delay line, a middle delay line, a phase detector and a shift register. The delay line receives the internal clock signal, delays the internal clock signal for a predetermined time, and generates the recovery locking signal. The middle delay line receives the input signal, delays the input signal for a predetermined time, and generates a middle input signal. The phase detector compares the phase of the middle input signal with the phase of the recovery locking signal, detects the phase difference between the middle input signal and the recovery locking signal, and generates at least one of a first move signal and a second move signal. The resister controls the delay time of the delay line in response to the at least one of the first and second move signals. In one embodiment, the phase detector compares the phase of the recovery locking signal with the phases of the middle input signal at rising and falling edges and detects the phase difference between the recovery locking signal and the middle input signal. In one embodiment, the phase detector includes a first flip-flop which receives the middle input signal as a clock signal, receives the recovery locking signal in response to the clock signal, and outputs the recovery locking signal; a first buffer which delays the recovery locking signal for a predetermined time; a second flip-flop which receives the middle input signal as a clock signal, receives the output signal of the first buffer in response to the clock signal, and outputs the output signal of the first buffer; a first logical AND means which performs a logical AND operation on the output signal of the first flip-flop and the output signal of the second flip-flop and generates the first move signal; and a second logical AND means which performs a logical AND operation on an inverted signal of the output signal of the first flip-flop and an inverted signal of the output signal of the second flip-flop and generates the second move signal. The first buffer can have the same delay time as a unit delay device existing in the delay line.

In one embodiment, the first move signal reduces the delay time of the delay line by controlling the shift register, and the second move signal increases the delay time of the delay line by controlling the shift register. In another embodiment, the first move signal increases the delay time of the delay line by controlling the shift register and the second move signal decreases the delay time of the delay line by controlling the shift register.

In another aspect of the invention, there is provided a data recovery method of a data recovery circuit including a frequency-locked loop and a delay-locked loop, the method including: (a) locking the frequency of an internal clock signal fed back into the frequency-locked loop in response to an input signal with the frequency of an input signal and generating a frequency locking signal representing that the internal clock signal is frequency-locked with the input signal; (b) determining whether the frequency of the internal clock signal is in a predetermined frequency range of the input signal in response to the frequency locking signal and generating a phase control signal; receiving the input signal and the internal clock signal in response to the phase controlled signal and locking the phase of the internal clock signal with the phase of the input signal and generating a recovery locking signal, locking the phase of the internal clock signal with the phase of the input signal in response to the input signal and the internal clock signal and generating a recovery locking signal; and (d) receiving the recovery locking signal as a clock signal, receiving the input signal in response to the clock signal, and outputting the input signal as output data.

Accordingly, the data recovery circuit and method according to the present invention are capable of simultaneously reducing jitter and locking time.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
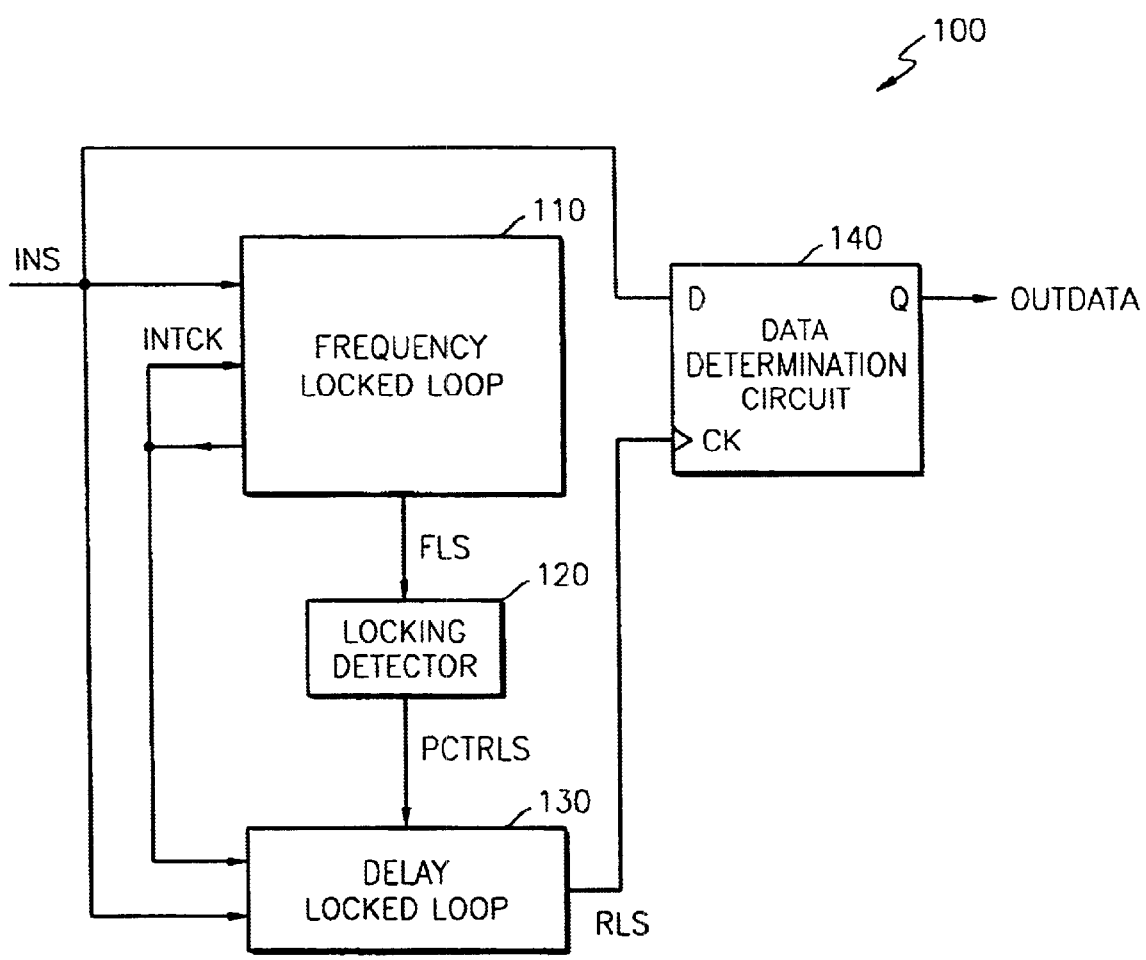
FIG. 1 is a circuit diagram illustrating a data recovery circuit according to an embodiment of the present invention.

Referring to FIG. 1, a data recovery circuit 100 according to an embodiment of the present invention includes a frequency-locked loop 110, a locking detector 120, a delay-locked loop 130, and a data determination circuit 140.

The frequency-locked loop 110 locks the frequency of an internal clock signal INTCK with the frequency of an input signal INS in response to the input signal INS and generates a frequency locking signal FLS representing that the input signal INS is frequency-locked with the internal clock signal INTCK. The locking detector 120 determines whether the internal clock signal INTCK is in a predetermined frequency range of the input signal INS in response to the frequency locking signal FLS and generates a phase control signal PCTRLS. The delay-locked loop 130 is controlled by the phase control signal PCTRLS, phase-locks the internal clock signal INTCK with the input signal INS in response to the input signal INS and the internal clock signal INTCK, and generates a recovery locking signal RLS. The data determination circuit 140 receives the recovery locking signal RLS as a clock signal CK, receives the input signal INS in response to the clock signal CK, and outputs the input signal INS as output data OUTDATA.

Figure 2:
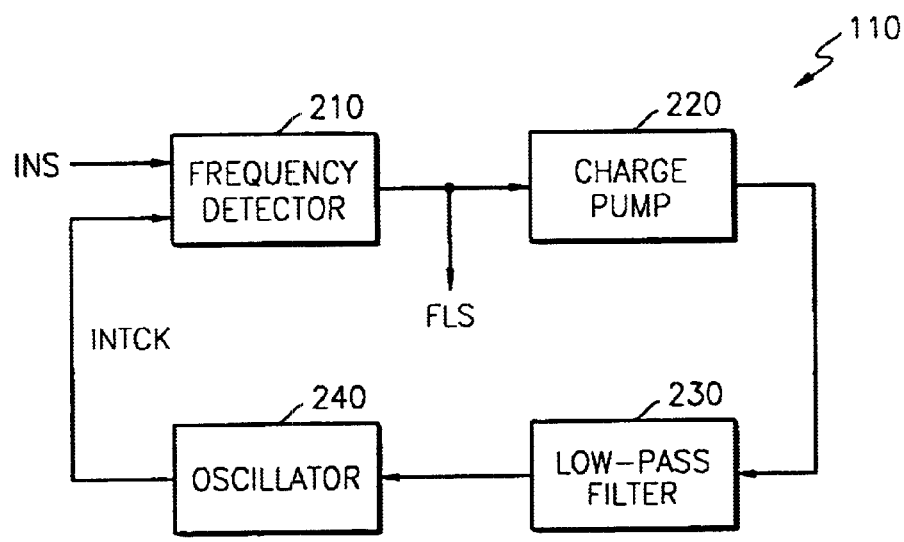
FIG. 2 is a block diagram illustrating the frequency-locked loop shown in FIG. 1.

Referring to FIG. 2, the frequency-locked loop 110 includes a frequency detector 210, a charge pump 220, a low-pass filter 230, and an oscillator 240.

The frequency detector 210 compares the frequency of the input signal INS with the frequency of the internal clock signal INTCK, detects the frequency difference between the input signal INS and the internal clock signal INTCK, and generates the frequency locking signal FLS. In further detail, the frequency detector 210 compares the frequencies of the input signal INS at rising and falling edges with the frequency of the internal clock signal INTCK and detects the frequency difference between the input signal INS and the internal clock signal INTCK. The charge pump 220 is charged or discharged in response to the output of the frequency detector 210. The low-pass filter 230 removes a high-frequency component from the output signal of the charge pump 220 and generates a control voltage. The oscillator 240 generates the internal clock signal INTCK in response to the control voltage.

Hereinafter the operation and data recovery method of the data recovery circuit 100 according to an embodiment of the present invention will be described in greater detail with reference to FIGS. 1 and 2.

The frequency-locked loop 110 in the data recovery circuit 100 locks the frequency of the internal clock signal INTCK, which is fed back to the frequency-locked loop 110 in response to the input signal INS, with the frequency of the input signal INS and generates the frequency locking signal FLS representing that the input signal INS is frequency-locked with the internal clock signal INTCK.

Specifically, the frequency detector 210 in the frequency-locked loop 110 measures the frequencies of the input signal INS and the internal clock signal INTCK generated by the oscillator 240, detects the frequency difference between the input signal INS and the internal clock signal INTCK, and generates the frequency locking signal FLS. In addition, the frequency detector 210 applies the frequency difference between the input signal INS and the internal clock signal INTCK to the charge pump 220. The low-pass filter 230 removes a high-frequency component from the output signal of the charge pump 220 and generates a control voltage. The control voltage is a direct current voltage. The frequency of the internal clock signal INTCK generated in the oscillator 240 is increased or decreased depending on the magnitude of the control voltage and thus is locked with the frequency of the input signal INS. That is, if the frequency of the internal clock signal INTCK generated in the oscillator 240 is lower than the frequency of the input signal INS, the control voltage of the low-pass filter 230 increases in proportion to the frequency difference between the internal clock signal and the input signal INS. As a result, the frequency of the internal clock signal INTCK is increased and thus is equal to the frequency of the input signal INS.

Alternatively, if the frequency of the internal clock signal generated in the oscillator 240 is higher than the frequency of the input signal INS, the control voltage of the low-pass filter 230 decreases in proportion to the frequency difference between the internal clock signal INTCK and the input signal INS. As a result, the frequency of the internal clock signal INTCK is decreased and thus is equal to the frequency of the input signal INS.

The frequency-locked loop 110 locks the frequency of the internal clock signal INTCK with the frequency of the input signal INS through such operations as described above. Here, the frequency detector 210 may be designed using a dual edge trigger flip-flop, in which case the resolution of the frequency detector 210 can be enhanced because the frequency detector 210 detects a frequency difference between the internal clock signal INTCK and the input signal INS by comparing the frequency of the internal clock signal INTCK with the frequencies of the input signal INS at rising and falling edges.

The locking detector 120 receives the frequency locking signal FLS representing that the input signal INS is locked with the internal clock signal INTCK, determines whether or not the frequency of the internal clock signal INTCK is in a predetermined frequency range of the input signal INS, and generates the phase control signal PCTRLS for controlling the operation of the delay-locked loop 130.

If the frequency of the internal clock signal INTCK is in a range of 5% of the frequency of the input signal INS, the locking detector 120 determines that the internal clock signal INTCK is locked with the input signal INS and generates the phase control signal PCTRLS. The delay-locked loop 130 is turned on or off by the phase control signal PCTRLS.

The locking detector 120 has a lock window with hysteresis characteristics and thus prevents the frequency-locked loop 110 from deviating from a locked state. That is, even if the frequency of the internal clock signal INTCK is beyond the lock window for a period due to noise caused by a power supply or impulse noise with the frequency-locked loop 110 locked, the frequency-locked loop 110 can be prevented from deviating from a locking state owing to the hysteresis characteristics of the lock window.

The delay-locked loop 130 does not use an oscillator and takes advantage of the delay characteristics of delay devices. Thus, it is possible to reduce the locking time and output jitter. In addition, during the use of the delay-locked loop 130, a phase offset generated in a charge pump during phase locking after frequency locking in a data recovery circuit demanding a wide locking range, such as an optical storage system, acts as skew. Thus, a problem with deterioration of the bit error rate of the data recovery circuit can be overcome. The delay-locked loop 130 will be described greater in detail.

Figure 3:
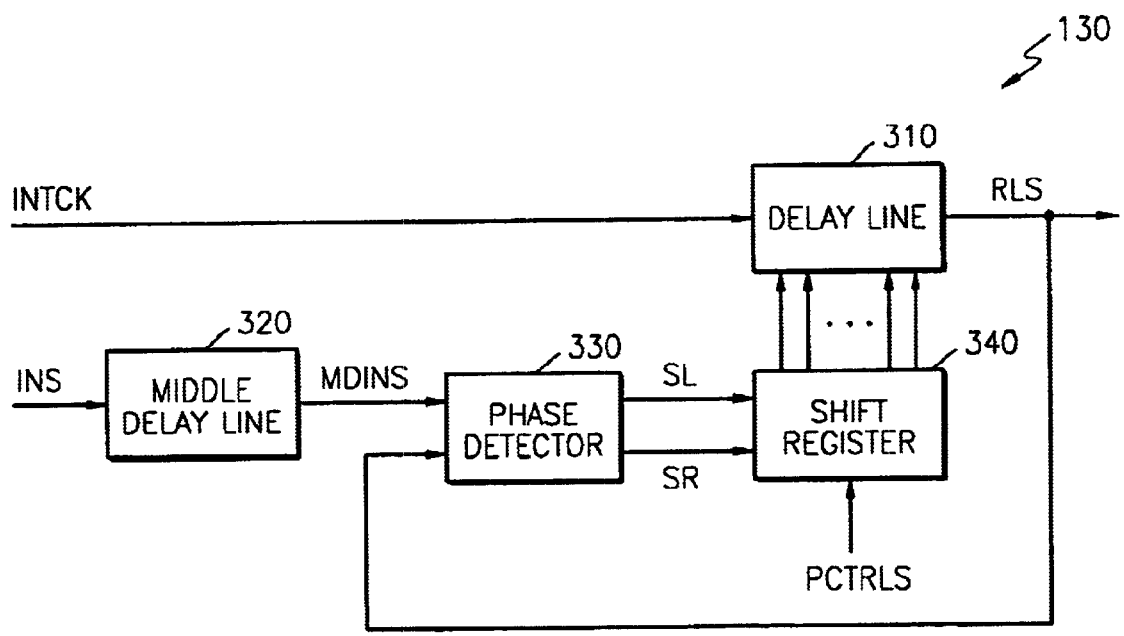
FIG. 3 is a block diagram illustrating the delay-locked loop shown in FIG. 1.

Referring to FIG. 3, the delay-locked loop 130 includes a delay line 310, a middle delay line 320, a phase detector 330, and a shift resister 340.

The delay line 310 receives the internal clock signal INTCK, delays the internal clock signal for a predetermined time, and generates the recovery locking signal RLS. The middle delay line 320 receives the input signal INS, delays the input signal for a predetermined time, and generates a middle input signal MDINS. The phase detector 330 compares the phase of the middle input signal MDINS with the phase of the recovery locking signal RLS, detects the phase difference between the middle input signal MDINS and the recovery locking signal RLS, and generates a first move signal SL or a second move signal SR. The shift resister 340 controls the delay time of the delay line 310 in response to the first or second move signal SL or SR.

The operation of the delay-locked loop 130 will be described in greater detail with reference to FIG. 3.

The delay line 310 includes a plurality of delay devices (not shown) and delays the internal clock signal INTCK. The middle delay line 320 includes a plurality of delay devices and, in one embodiment, the number of delay devices is equivalent to half of the number of the delay devices constituting the delay line 310. Accordingly, if the total delay time of the delay line 310 is referred to as T, the middle input signal MDINS is generated by delaying the input signal INS for T/2. Since the recovery locking signal RLS is locked with the middle input signal MDINS, the middle delay line 320 helps the delay-locked loop 130 begin to lock the internal clock signal INTCK with the input signal in a state where the internal clock signal INTCK is delayed for T/2 by the delay line 310.

The phase detector 330 detects the phase difference between the middle input signal MDINS and the recovery locking signal RLS. If the phase of the internal clock signal INTCK leads the phase of the middle input signal MDINS, the phase detector 330 allows the internal clock signal INTCK pass through a greater number of delay devices in the delay line 310 before it is output. If the phase of the internal clock signal lags the phase of the middle input signal MDINS, the phase detector 330 allows the internal clock signal INTCK pass through fewer delay devices of the delay line 310 before it is output.

In the delay-locked loop 130, the output jitter has a magnitude equivalent to the delay time of each of the delay devices (or a unit delay device) in the delay line 310. Thus, as the delay time of each of the delay devices (or the unit delay device) is decreased, the output jitter becomes smaller. However, if the delay time of each of the delay devices (or the unit delay device) is reduced, the locking range of the whole phase is also reduced, and this problem must be taken into consideration first when designing a delay-locked loop.

Figure 4:
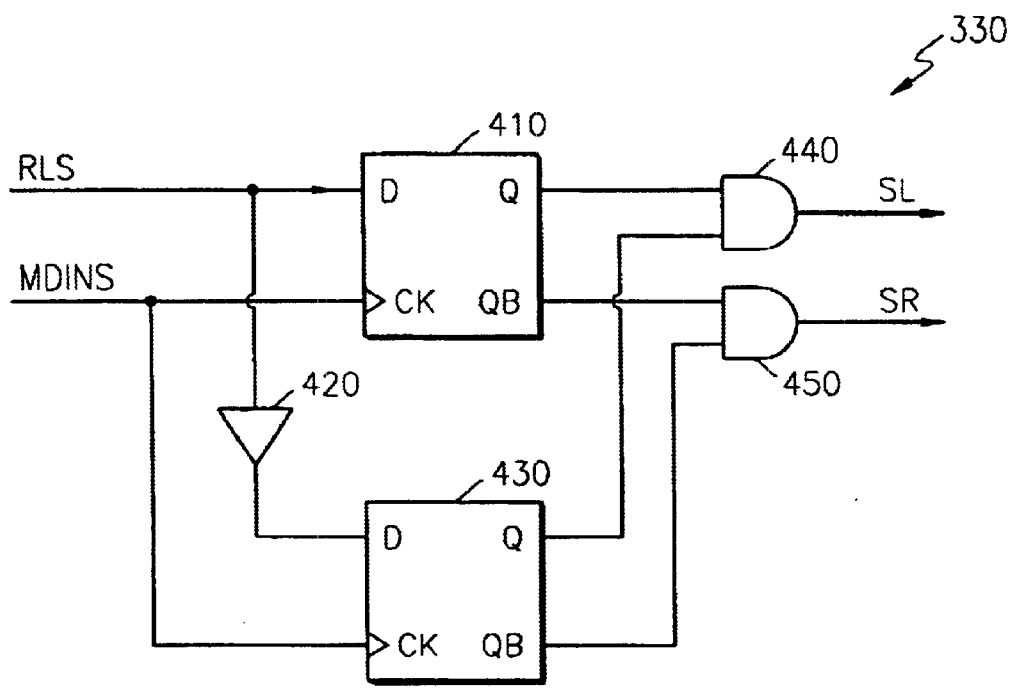
FIG. 4 is a circuit diagram illustrating the phase detector shown in FIG. 3.

Referring to FIG. 4, the phase detector 330 includes a first flip-flop 410, a first buffer 420, a second flip-flop 430, a first logic AND means 440, and a second logic AND means 450.

The first flip-flop 410 receives the middle input signal as a clock signal, receives the recovery locking signal RLS in response to the clock signal, and outputs the recovery locking signal RLS. The first buffer 420 delays the recovery locking signal RLS for a predetermined time. Specifically, the first buffer 420 has the same delay time as one of the delay devices constituting the delay line 310. The second flip-flop 430 receives the middle input signal MDINS as a clock signal, receives the output signal of the first buffer 420 in response to the clock signal, and outputs the output signal of the first buffer 420. The first logical AND means 440 performs a logical AND operation on the output signals of the first flip-flop 410 and the second flip-flip 430 and thus generates the first move signal SL. The second logical AND means 450 performs a logical AND operation on an inverted signal of the output signal of the first flip-flop 410 and an inverted signal of the output signal of the second flip-flop 430 and thus generates the second move signal SR.

Figure 5:
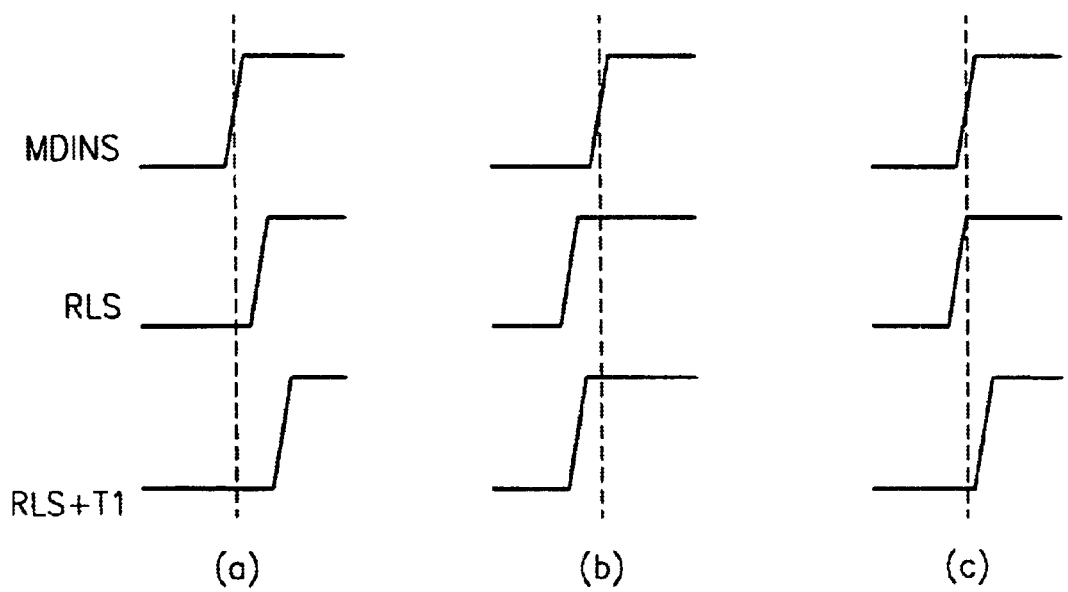
FIG. 5 is a timing diagram illustrating the operation of the phase detector shown in FIG. 4.

Hereinafter, the operation of the phase detector 330 will be described in greater detail with reference to FIGS. 4 and 5.

If the phase of the middle input signal MDINS leads the phase of the recovery locking signal RLS, the phase detector 330 generates the second move signal SR. That is, as shown in FIG. 5(a), since the recovery locking signal RLS and a signal generated by delaying the recovery locking signal RLS for a delay time TI of the first buffer 420 are at a low level, the output signals of the first and second flip-flops 410 and 430 are also at a low level and only the second move signal SR is at a high level and is selected. As a result, the shift resister 340 controls the delay amount of the delay line 310 in response to the second move signal SR and thus phase-locks the middle input signal MDINS with the recovery locking signal RLS.

If the phase of the middle input signal MDINS lags the phase of the recovery locking signal RLS, the phase detector 330 generates the first move signal SL. That is, as shown in FIG. 5(b), since the recovery locking signal RLS and a signal generated by delaying the recovery locking signal RLS for a delay time T1 of the first buffer 420 are at a high level, the output signals of the first and second flip-flops 410 and 430 are also at a high level and only the first move signal SL is at high level and is selected. As a result, the shift resister 340 controls the delay amount of the delay line 310 in response to the first move signal SL and thus phase-locks the middle input signal MDINS with the recovery locking signal RLS.

FIG. 5(c) illustrates a case in which the phase of the recovery locking signal RLS is locked with the phase of the middle input signal MDINS. In FIG. 5(c), both the first and second move signals SL and SR are at a low level, and thus the shift resister 340 does not operate.

Here, the phase detector 330 may be designed using a dual edge trigger flip-flop, in which case the resolution of the phase detector 330 can be enhanced because the phase detector 330 detects a phase difference between the middle input signal MDINS and the recovery locking signal RLS by comparing the phase of the recovery locking signal RLS with the phase of the middle input signal MDINS at rising and falling edges.

As described above, the data recovery circuit according to the present invention and the method thereof are capable of simultaneously reducing jitter and locking time.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A data recovery circuit comprising:
    a frequency-locked loop which locks the frequency of an internal clock signal fed back into the frequency-locked loop in response to an input signal with the frequency of the input signal and generates a frequency locking signal representing that the internal clock signal is frequency-locked with the input signal;
    a locking detector which determines whether the frequency of the internal clock signal is in a predetermined frequency range of the input signal in response to the frequency locking signal and generates a phase control signal;
    a delay-locked loop controlled by the phase control signal which locks the phase of the internal clock signal with the phase of the input signal and generates a recovery locking signal; and
    a data determination circuit which receives the recovery locking signal as a clock signal and receives the input signal in response to the clock signal, and outputs the input signal as output data.

2. The data recovery circuit of claim 1, wherein the frequency-locked loop comprises:
    a frequency detector which compares the frequency of the input signal with the frequency of the internal clock signal, detects the frequency difference between the input signal and the internal clock signal, and generates the frequency locking signal;
    a charge pump which is charged or discharged in response to the output of the frequency detector;
    a low-pass filter which removes a high-frequency component from the output signal of the charge pump and generates a control voltage; and
    an oscillator which generates the internal clock signal in response to the control voltage, compares the frequency of the internal clock signal with the frequencies of the input signal at rising and falling edges, and detects the frequency difference between the internal clock signal and the input signal.

3. The data recovery circuit of claim 1, wherein a lock window of the locking detector has hysteresis characteristics in order to prevent the frequency-locked loop from deviating from a locked state.

4. The data recovery circuit of claim 1, wherein the delay-locked loop comprises:
    a delay line which receives the internal clock signal, delays the internal clock signal for a predetermined time, and generates the recovery locking signal;
    a middle delay line which receives the input signal, delays the input signal for a predetermined time, and generates a middle input signal;
    a phase detector which compares the phase of the middle input signal with the phase of the recovery locking signal, detects the phase difference between the middle input signal and the recovery locking signal, and generates at least one of a first move signal and a second move signal; and
    a shift resister which controls the delay time of the delay line in response to the at least one of the first and second move signals.

5. The data recovery circuit of claim 4, wherein the phase detector compares the phase of the recovery locking signal with the phases of the middle input signal at rising and falling edges and detects the phase difference between the recovery locking signal and the middle input signal.

6. The data recovery circuit of claim 4, wherein the phase detector comprises:
    a first flip-flop which receives the middle input signal as a clock signal, receives the recovery locking signal in response to the clock signal, and outputs the recovery locking signal;
    a first buffer which delays the recovery locking signal for a predetermined time;
    a second flip-flop which receives the middle input signal as a clock signal, receives the output signal of the first buffer in response to the clock signal, and outputs the output signal of the first buffer;
    a first logical AND means which performs a logical AND operation on the output signal of the first flip-flop and the output signal of the second flip-flop and generates the first move signal; and
    a second logical AND means which performs a logical AND operation on an inverted signal of the output signal of the first flip-flop and an inverted signal of the output signal of the second flip-flop and generates the second move signal.

7. The data recovery circuit of claim 6, wherein the first buffer has the same delay time as a unit delay device existing in the delay line.

8. The data recovery circuit of claim 4, wherein the first move signal reduces the delay time of the delay line by controlling the shift register, and the second move signal increases the delay time of the delay line by controlling the shift register.

9. The data recovery circuit of claim 4, wherein the first move signal increases the delay time of the delay line by controlling the shift register and the second move signal decreases the delay time of the delay line by controlling the shift register.

10. A data recovery method of a data recovery circuit including a frequency-locked loop and a delay-locked loop, the method comprising:

(a) locking the frequency of an internal clock signal fed back into the frequency-locked loop in response to an input signal with the frequency of an input signal and generating a frequency locking signal representing that the internal clock signal is frequency-locked with the input signal;

(b) determining whether the frequency of the internal clock signal is in a predetermined frequency range of the input signal in response to the frequency locking signal and generating a phase control signal;

(c) receiving the input signal and the internal clock signal in response to the phase controlled signal and locking the phase of the internal clock signal with the phase of the input signal and generating a recovery locking signal; and (d) receiving the recovery locking signal as a clock signal, receiving the input signal in response to the clock signal, and outputting the input signal as output data.

11. The method of claim 10, wherein step (a) comprises:

(a1) comparing the frequency of the input signal with the frequency of the internal clock signal, detecting the frequency difference between the input signal and the internal clock signal, and generating the frequency locking signal;

(a2) increasing or decreasing charge in response to the output of the (a1) step and generating a charge signal;

(a3) removing a high-frequency component from the charge signal and generating a control voltage; and (a4) generating the internal clock signal to be frequency-locked with the input signal in response to the control voltage, wherein, in step (a1), the frequency of the internal clock signal is compared with the frequency of the input signal at rising and falling edges and the frequency difference is detected.

12. The method of claim 10, wherein in step (b), a frequency range, within which the phase control signal is generated, has hysteresis characteristics in order to prevent the frequency-locked loop from deviating from a locked state.

13. The method of claim 10, wherein step (c) comprises:

(c1) generating the recovery locking signal by receiving the internal clock signal and delaying the internal clock signal for a predetermined time;

(c2) generating a middle input signal by receiving the input signal and delaying the input signal for a predetermined time;

(c3) comparing the phase of the middle input signal with the phase of the recovery locking signal, and generating at least one of a first move signal and a second move signal; and (c4) generating a shift signal for controlling the extent to which the internal clock signal is delayed in response to the at least one of the first and second move signal.

14. The method of claim 13, wherein in step (c3), the phase of the recovery locking signal is compared with the phases of the middle input signal at rising and falling edges.

15. The method of claim 13, wherein step (c3) comprises:

(c31) receiving the middle input signal as a clock signal, receiving the recovery locking signal in response to the clock signal, and outputting the recovery locking signal;

(c32) delaying the recovery locking signal for a predetermined time;

(c33) receiving the middle input signal as a clock signal, receiving the recovery locking signal delayed for the predetermined time in response to the clock signal, and outputting the delayed recovery locking signal;

(c34) generating the first move signal by performing a logic AND operation on the output signal of step (c31) and the output signal of step (c33); and (c35) generating the second move signal by performing a logical AND operation on an inverted signal of the output signal of step (c31) and an inverted signal of the output signal of step (c33).

16. The method of claim 13, wherein the first move signal reduces the delay time of the delay line by controlling the shift register and the second move signal increases the delay time of the delay line by controlling the shift register.

17. The method of claim 13, wherein the first move signal reduces the delay time of the delay line by controlling the shift register and the second move signal increases the delay time of the delay line by controlling the shift register.

* * * * *